(12) United States Patent
Yamaguchi et al.

(10) Patent No.: US 9,293,610 B2
(45) Date of Patent: Mar. 22, 2016

(54) EASY-ADHESIVE FOR SOLAR CELL REAR SURFACE PROTECTION SHEET, SOLAR CELL REAR SURFACE PROTECTION SHEET, AND SOLAR CELL MODULE

(75) Inventors: Hiroshi Yamaguchi, Tokyo (JP); Mitsuo Umezawa, Tokyo (JP); Makoto Yanagisawa, Tokyo (JP); Masaki Yaginuma, Tokyo (JP); Satoshi Maeda, Tokyo (JP)

(73) Assignee: Toyo Ink SC Holdings Co., Ltd., Tokyo (JP)

( * ) Notice: Subject to any disclaimer, the term of this patent is extended or adjusted under 35 U.S.C. 154(b) by 550 days.

(21) Appl. No.: 13/808,526

(22) PCT Filed: Jul. 4, 2011

(86) PCT No.: PCT/JP2011/003792
§ 371 (c)(1),
(2), (4) Date: Jan. 4, 2013

(87) PCT Pub. No.: WO2012/004961
PCT Pub. Date: Jan. 12, 2012

(65) Prior Publication Data
US 2013/0104978 A1    May 2, 2013

(30) Foreign Application Priority Data
Jul. 7, 2010    (JP) .................... 2010-154392

(51) Int. Cl.
*H01L 31/048*    (2014.01)
*C09J 133/04*    (2006.01)
(Continued)

(52) U.S. Cl.
CPC ...... *H01L 31/02167* (2013.01); *C08G 18/6229* (2013.01); *C08G 18/6237* (2013.01);
(Continued)

(58) Field of Classification Search
CPC ............ C08G 18/6229; C08G 18/6237; C08G 18/8116; H01L 31/048; H01L 31/04; H01L 31/0481; C09J 133/04; C09J 7/02; C09D 133/04
See application file for complete search history.

(56) References Cited

U.S. PATENT DOCUMENTS

| | | | |
|---|---|---|---|
| 2006/0051698 A1* | 3/2006 | Miyoshi et al. | 430/270.1 |
| 2008/0050583 A1 | 2/2008 | Kubo | |
| 2009/0239060 A1* | 9/2009 | Tomino | 428/323 |
| 2010/0273934 A1* | 10/2010 | Kohler et al. | 524/556 |

FOREIGN PATENT DOCUMENTS

| | | |
|---|---|---|
| JP | 2001-119051 | 4/2001 |
| JP | 2002026343 A * | 1/2002 |

(Continued)

OTHER PUBLICATIONS

English translation of JP 2002-026343.*

*Primary Examiner* — Marla D McConnell
(74) *Attorney, Agent, or Firm* — Fanelli Haag PLLC

(57) ABSTRACT

To overcome a problem in related art and to provide an easy-adhesive having an excellent adhesive property and an excellent adhesive durability for a solar cell rear surface protection sheet, a solar cell rear surface protection sheet, and a solar cell module formed by using the solar cell rear surface protection sheet. An easy-adhesive for a solar cell rear surface protection sheet according to the present invention exhibits a specific glass transition temperature, a specific number average molecular weight, and a specific hydroxyl value. Further, the easy-adhesive for a solar cell rear surface protection sheet contains a (meth)acrylic-based copolymer (A) that contains a carbon-carbon double bond in a side chain at a specific rate, and a polyisocyanate compound (B) at a specific rate.

7 Claims, 1 Drawing Sheet

(51) Int. Cl.
  *C09D 133/04* (2006.01)
  *C09D 175/04* (2006.01)
  *C09J 7/02* (2006.01)
  *H01L 31/0216* (2014.01)
  *C08G 18/62* (2006.01)
  *C08G 18/80* (2006.01)
  *C08G 18/81* (2006.01)
  *C09J 175/16* (2006.01)

(52) U.S. Cl.
  CPC .......... *C08G18/807* (2013.01); *C08G 18/8116* (2013.01); *C09D 133/04* (2013.01); *C09D 175/04* (2013.01); *C09J 7/02* (2013.01); *C09J 133/04* (2013.01); *C09J 175/16* (2013.01); *H01L 31/048* (2013.01); *Y02E 10/50* (2013.01); *Y10T 428/2887* (2015.01)

(56) References Cited

FOREIGN PATENT DOCUMENTS

| | | |
|---|---|---|
| JP | 2002-356644 | 12/2002 |
| JP | 2004-200322 | 7/2004 |
| JP | 2004-223925 | 8/2004 |
| JP | 2006-152013 | 6/2006 |
| JP | 2007-136911 | 6/2007 |
| JP | 2009-246360 | 10/2009 |
| JP | 2010-114154 | 5/2010 |
| JP | 2010-263193 | 11/2010 |
| JP | 2011-018872 | 1/2011 |
| JP | 2011-105819 | 6/2011 |
| WO | WO 2009071506 A1 * | 6/2009 |

* cited by examiner

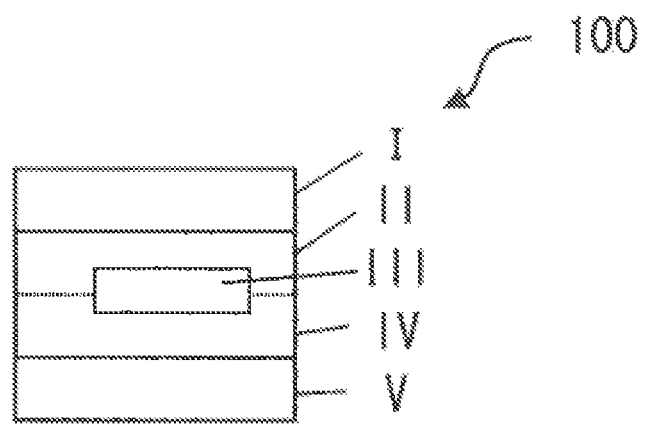

EASY-ADHESIVE FOR SOLAR CELL REAR SURFACE PROTECTION SHEET, SOLAR CELL REAR SURFACE PROTECTION SHEET, AND SOLAR CELL MODULE

This application is a U.S. National Stage Application of PCI International Patent Application No. PCT/JP2011/003792, which was filed on Jul. 4, 2011 and claims priority to Japanese Patent Application No. 2010-154392, which was filed Jul. 7, 2010, the disclosure of each of which is incorporated herein by reference in its entirety.

TECHNICAL FIELD

The present invention relates to an easy-adhesive for a solar cell rear surface protection sheet, and in particular to an adhesive having an excellent adhesive property and an excellent easy-adhesive durability for a solar cell rear surface protection sheet. Further, the present invention relates to a solar cell rear surface protection sheet formed by using the easy-adhesive for a solar cell rear surface protection sheet. Further, the present invention also relates to a solar cell module formed by using the sheet.

BACKGROUND ART

In recent years, because of the increased awareness of environmental issues, solar cells have attracted attention as clean energy sources that cause no environmental pollution. Therefore, solar cells have been diligently studied for the use of solar energy as useful energy resources, and thereby have been commercialized.

There are various forms of solar cell elements. Typical examples of such solar cell elements include a crystalline silicon solar cell element, a polycrystalline silicon solar cell element, an amorphous silicon solar cell element, a copper indium selenide solar cell element, and a compound semiconductor solar cell element. Among them, the polycrystalline silicon solar cell element, the amorphous silicon solar cell element, and the compound semiconductor solar cell element are relatively inexpensive and can be manufactured in a large size. Therefore, they have been actively studied and developed in various fields. Further, among these solar cell elements, a thin-film solar cell element, which is typified by an amorphous silicon solar cell element that is obtained by laminating silicon on a conductive metal substrate and forming a transparent conducive layer on the laminate, is lightweight and excellent in the impact resistance and the flexibility. Therefore, the thin-film solar cell element has been regarded as a promising solar cell element as the form of solar cell in the future.

Among the solar cell modules, a simple one has such a structure that a sealing agent and a glass plate are successively laminated on both sides of a solar cell element. Since the glass plate is excellent in the transparency, the weatherproof property, and the friction resistance, it is commonly used as protection material on the solar-light-receiving side at the present time. However, for the non-light-receiving side that does not need to be transparent, various solar cell rear surface protection sheets (hereinafter also referred to as "rear surface protection sheets") other than the glass plate have been proposed in consideration of the cost, the safety, and the workability (for example, Patent literature 1). Therefore, the glass plates are beginning to be replaced by rear surface protection sheets. Further, ethylene-vinyl acetate copolymer (hereinafter referred to as "EVA") having high transparency and excellent moisture resistance is usually used for the sealing agent.

Examples of the rear surface protection sheet include (i) a single-layer film such as a polyester film, (ii) a film obtained by forming a vapor-deposition layer of a metal oxide or a nonmetal oxide on a polyester film or the like, and (iii) a multilayer film obtained by laminating films such as a polyester film, a fluorine-based film, an olefin film, and an aluminum foil.

Various properties can be added to a rear surface protection sheet having a multilayer structure because of its multilayer structure. For example, an insulating property can be added by using a polyester film. Further, a water vapor barrier property can be added by using an aluminum foil (see Patent literatures 2 to 4). What kind of the rear surface protection sheet is actually used may be determined as appropriate depending on the product/use in which the solar cell module is used.

Among those various properties required for the rear surface protection sheet, an adhesive property with a sealing agent and an adhesive durability are fundamental and important required properties. If the adhesive property with the sealing agent is unsatisfactory, the rear surface protection sheet could be pealed and the solar cell cannot be protected from moisture and other external factors, and thus leading to the deterioration in the output performance of the solar cell.

As a method for ensuring the adhesive property with the sealing agent, there are known methods including (1) a method in which easy-adhesion treatment is carried out on a surface of the rear surface protection sheet that comes into contact with the sealing agent, and (2) a method in which a film having a high adhesive property with the sealing agent is used on a surface of the rear surface protection sheet that comes into contact with the sealing agent.

Examples of the above-described method (1) include surface treatment such as corona treatment, and easy-adhesion coating treatment in which an easy-adhesive is coated.

However, although the former method, i.e., the surface treatment such as corona treatment can ensure the initial adhesive property, there is a problem that the adhesive durability is poor.

Patent literatures 1, 5 and 6 disclose easy-adhesives that are used for the latter method, i.e., the easy-adhesion coating treatment.

Patent literature 5 discloses a coating liquid containing a cross-linking agent selected from a group consisting of a polymer containing an oxazoline group, a urea resin, a melamine resin, and an epoxy resin, and a resin component other than the cross-linking agent selected from a polyester resin or an acrylic resin whose glass transition point is 20-100° C. (see claims 2 and 3 of the patent literature). More specifically, Patent literature 5 discloses an example in which a coating liquid containing an epoxy resin and an acrylic resin is used (see Example 5 of the patent literature). However, the adhesive strength with the EVA sheet in this example is about 10-20 N for 20 mm width (i.e., 7.5-15 N for 15 mm width) (see Table 2 of the patent literature). Since the adhesive property between the sealing agent and the rear surface protection sheet has a significant influence on the deterioration in the output performance of the solar cell, the market demands a higher adhesive property and the reliability for the adhesive property under stricter conditions. The adhesive strength of about 20 N for 20 mm width cannot satisfy such demands in the market. Although the adhesive strength is improved in Patent literature 1, the market demands easy-adhesives having higher properties.

Patent literature 6 discloses such a configuration that an adhesion-improving layer in which at least one type of a resin selected from a group consisting of a polyester-based resin and a polyester polyurethane-based resin is cross-linked by a cross-linking agent composed of alkylated melamine or polyisocyanate on a polyester film is provided on a surface of a rear surface protection sheet that comes into contact with a sealing agent.

As for the above-described method (2) (method in which a film having a high adhesive property with the sealing agent is used on a surface of the rear surface protection sheet that comes into contact with the sealing agent), Patent literature 7, for example, discloses a method using polybutylene terphthalate (PET).

However, since the film like this usually has a thickness of several tens of micrometers, the cost becomes higher in comparison to the above-described easy-adhesion treatment.

Further, Patent literature 8, which is laid open after the previous application from which the present application claims priority was filed, discloses a back sheet for a solar cell module in which an adhesive layer composed of an acryl-based adhesive containing an acrylic polymer that is obtained by polymerizing a monomer component containing a monomer expressed by a general formula (I) shown below on a surface that is bonded to filler material (sealing agent) constituting the solar cell module is formed.

<Chemical 1>

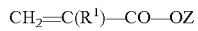  Formula (1)

In the formula, $R^1$ represents a hydrogen atom or a methyl group, and Z represents a hydrocarbon group having a carbon number of 4-25.

Further, Patent literature 9 discloses a rear surface protection sheet of a solar cell element including: a primer layer composed of a fluoric copolymer, an acrylic copolymer, or a polyurethane-based copolymer (polymer a); a polymeric monomer and/or an oligomer having at least one ethylene unsaturated group for photo-curing (monomer b); and/or a compound containing at least one ethylene unsaturated group and two or more isocyanate groups in the molecule (polyisocyanate c).

CITATION LIST

Patent Literature

Patent literature 1: Japanese Unexamined Patent Application Publication No. 2009-246360
Patent literature 2: Japanese Unexamined Patent Application Publication No. 2004-200322
Patent literature 3: Japanese Unexamined Patent Application Publication No. 2004-223925
Patent literature 4: Japanese Unexamined Patent Application Publication No. 2001-119051
Patent literature 5: Japanese Unexamined Patent Application Publication No. 2006-152013
Patent literature 6: Japanese Unexamined Patent Application Publication No. 2007-136911
Patent literature 7: Japanese Unexamined Patent Application Publication No. 2010-114154
Patent literature 8: Japanese Unexamined Patent Application Publication No. 2010-263193
Patent literature 9: Japanese Unexamined Patent Application Publication No. 2011-18872

SUMMARY OF INVENTION

Technical Problem

An object of the present invention is to provide an easy-adhesive having an excellent adhesive property and an excellent adhesive durability for a solar cell rear surface protection sheet, a solar cell rear surface protection sheet, and a solar cell module formed by using the solar cell rear surface protection sheet.

Solution to Problem

The present invention relates to an easy-adhesive for a solar cell rear surface protection sheet, containing:
a (meth)acrylic-based copolymer (A) having a glass transition temperature of 10-60° C., a number average molecular weight of 25,000-250,000, and a hydroxyl value of 2-100 (mgKOH/g), and having one carbon-carbon double bond for every 5-500 side chains; and
a polyisocyanate compound (B), the polyisocyanate compound (B) being contained in such an amount that a number of an isocyanate group is 0.1-5 for every one hydroxyl group contained in the (meth)acrylic-based copolymer (A).

According to the present invention, the (meth)acrylic-based copolymer (A) is preferably a copolymer selected from a group consisting of following acrylic-based copolymers (A1) to (A4):
a (meth)acrylic-based copolymer (A1): a (meth)acrylic-based copolymer that is formed by reacting a (meth)acrylic-based monomer having a carboxyl group (a3) with a glycidyl group of a side chain contained in a copolymer containing a (meth)acrylic-based monomer having a glycidyl group (a1), a (meth)acrylic-based monomer having a hydroxyl group (a2), and a (meth)acrylic-based monomer having no glycidyl group, no hydroxyl group, and no carboxyl group (a4) as constitutional units;
a (meth)acrylic-based copolymer (A2): a (meth)acrylic-based copolymer that is formed by reacting a (meth)acrylic-based monomer having a glycidyl group (a1) with a carboxyl group contained in a copolymer containing a (meth)acrylic-based monomer having a carboxyl group (a3), a (meth)acrylic-based monomer having a hydroxyl group (a2), and a (meth)acrylic-based monomer having no glycidyl group, no hydroxyl group, and no carboxyl group (a4) as constitutional units;
a (meth)acrylic-based copolymer (A3): a (meth)acrylic-based copolymer that is formed by reacting a (meth)acrylic-based monomer having an isocyanate group (a5) with a part of a hydroxyl group contained in a copolymer containing a (meth)acrylic-based monomer having a hydroxyl group (a2) and a (meth)acrylic-based monomer having no hydroxyl group (a6) as constitutional units; and
a (meth)acrylic-based copolymer (A4): a (meth)acrylic-based copolymer that is formed by reacting a (meth)acrylic-based monomer having a hydroxyl group (a2) with an acid anhydride group contained in a copolymer containing a maleic anhydride, a (meth)acrylic-based monomer having a hydroxyl group (a2), and a (meth)acrylic-based monomer having no hydroxyl group (a6) as constitutional units.

Further, the polyisocyanate compound (B) is preferably a blocked polyisocyanate compound (B1).

Further, the present invention relates to a solar cell rear surface protection sheet (V') including: an uncured easy-adhesive layer (D') formed by the above-described easy-adhesive for a solar cell rear surface protection sheet; and a plastic film (E).

Further, the present invention relates to a solar cell module including: a solar battery cell (III); a solar cell front surface protection material (I) that protects the solar battery cell (III) through a sealing agent (II) disposed on a light-receiving side, the solar cell front surface protection material (I) being disposed on the light-receiving side; and a solar cell rear surface protection sheet (V) that protects the solar battery cell (III) through a sealing agent (IV) disposed on a non-light-receiving side, the solar cell rear surface protection sheet (V) being disposed on the non-light-receiving side, in which the solar cell rear surface protection sheet (V) is obtained by disposing a solar cell rear surface protection sheet (V') including a plastic film (E) and an uncured easy-adhesive layer (D') formed by an easy-adhesive for a solar cell rear surface protection sheet described in one of the above-described aspects in such a manner that the easy-adhesive layer (D') comes into contact with the sealing agent (IV) disposed on the non-light-receiving side, and curing the easy-adhesive layer (D').

Further, the sealing agent (IV) disposed on the non-light-receiving side preferably contains an organic peroxide. Further, the sealing agent (IV) disposed on the non-light-receiving side preferably contains an ethylene-vinyl acetate copolymer (EVA) as a main component.

Advantageous Effects of Invention

By using an easy-adhesive for a solar cell rear surface protection sheet according to the present invention, the present invention provides an advantageous effect that an easy-adhesive having an excellent adhesive property and an excellent adhesive durability for a solar cell rear surface protection sheet, a solar cell rear surface protection sheet, and a solar cell module formed by using the solar cell rear surface protection sheet can be provided. By using a solar cell rear surface protection sheet according to the present invention, it is possible to provide a solar cell module capable of minimizing the deterioration in the output performance even when the solar cell module is exposed to a high-temperature and high-humidity environment for a long time.

BRIEF DESCRIPTION OF DRAWINGS

FIG. 1 schematically shows a cross section of a solar cell module according to the present invention.

DESCRIPTION OF EMBODIMENTS

The present invention is explained hereinafter in detail. Note that needless to say, other exemplary embodiments are also included in the scope of the present invention as long as they meet the purport of the present invention. Further, in this specification, when a range of numerical values are specified by using a symbol "–", the values written in front and behind the symbol "–" are also included as the lower-limit value and the upper-limit value of the range. Further, in this specification, terms "film" and "sheet" are not differentiated according to the thickness. In other words, the term "sheet" in this specification includes films having a small thickness, and the term "film" in this specification includes sheets having a large thickness.

FIG. 1 is a schematic cross section of a solar cell module according to the present invention. A solar cell module 100 includes at least a solar cell front surface protection material (I), a light-receiving-side sealing agent (II), a solar battery cell (III), a non-light-receiving-side sealing agent (IV), and a solar cell rear surface protection sheet (V). The light-receiving side of the solar battery cell (III) is protected by the solar cell front surface protection material (I) through the light-receiving-side sealing agent (II). On the other hand, the non-light-receiving side of the solar battery cell (III) is protected by the solar cell rear surface protection sheet (V) through the non-light-receiving-side sealing agent (IV). An easy-adhesive layer composed of an easy-adhesive for a solar cell rear surface protection sheet (hereinafter, also referred to as "easy-adhesive") is laminated on the surface layer that comes into contact with the solar cell rear surface protection sheet (V) on the non-light-receiving side.

Note that the easy-adhesive layer (D') that is formed by an easy-adhesive for a solar cell rear surface protection sheet according to the present invention undergoes a cross-linking reaction by using a thermocompression bonding process that is carried out when the solar cell module 100 is formed. In the present invention, an easy-adhesive layer for which the thermocompression bonding process has not performed yet is referred to as "easy-adhesive layer (D')", and a cross-kinked easy-adhesive layer for which the thermocompression bonding process has already performed is referred to as "easy-adhesive layer (D)". In this manner they are differentiated from each other. Similarly, a solar cell rear surface protection sheet for which the thermocompression bonding process has not performed yet is referred to as "solar cell rear surface protection sheet (V')", and a solar cell rear surface protection sheet for which the thermocompression bonding process has already performed is referred to as "solar cell rear surface protection sheet (V)". In this manner they are differentiated from each other.

A (meth)acrylic-based copolymer (A) contained, in an easy-adhesive for a solar cell rear surface protection sheet according to the present invention is explained.

The (meth)acrylic-based copolymer (A) has a glass transition temperature of 10-60° C., a number average molecular weight of 25,000-250,000, and a hydroxyl value of 2-100 (mgKOH/g), and has one carbon-carbon double bond for every 5-500 side chains.

If the (meth)acrylic-based copolymer (A) has a glass transition temperature higher than 60° C., the coating of the easy-adhesive becomes harder and thus the adhesive strength with the sealing agent deteriorates. If it is lower than 10° C., tucks are generated on the surface of the easy-adhesive coating. Therefore, when the solar cell rear surface protection sheet is rolled after being manufactured, it tends to cause blocking. More preferably, the glass transition temperature of the (meth)acrylic-based copolymer (A) is 20-50° C.

Note that the glass transition temperature in this specification means a glass transition temperature of a resin that is obtained by drying the (meth)acrylic-based copolymer (A) to a 100% solid-content state, measured by the differential scanning calorimetry (DSC). For example, to obtain the glass transition temperature, an aluminum pan containing a sample that is obtained by weighing about 10 mg of the sample and another aluminum pan containing no sample are set in a DSC apparatus. They are rapidly cooled to −50° C. in a nitrogen gas stream by using liquid nitrogen. After that, they are heated to 100° C. at a rate of 20° C./minute. Then, a DSC curve is plotted. An extrapolation glass transition start temperature (Tig) is obtained from an intersection point between a straight line that is drawn by extending the baseline on the low temperature side of the DSC curve (section of the DSC curve in a temperature range in which no transition and no reaction occur in the test specimen) to the high temperature side and a tangential line that is drawn through such points that the slope of the curve in the step-like changing section of the glass transition is maximized. Then, this obtained extrapolation glass transition start temperature can be determined as the glass transition temperature. Values measured by the above-described method are used as glass transition temperatures according to the present invention.

If the number average molecular weight of the (meth)acrylic-based copolymer (A) is higher than 250,000, the adhesive strength with the sealing agent deteriorates, whereas if it is lower than 25,000, the moisture/heat resistance of the easy-adhesive coating deteriorates and thus the adhesive strength with the sealing agent deteriorates after the moisture/heat resistance test. The number average molecular weight of the (meth)acrylic-based copolymer (A) is preferably 25,000-150,000. More preferably, the number average molecular weight is 30,000-100,000. More preferably, the number average molecular weight is 30,000-75,000. Particularly preferably, the number average molecular weight is 30,000-50,000.

Note that the above-described number average molecular weight is a polystyrene-converted value of the (meth)acrylic-based copolymer (A) obtained by the gel permeation chromatography (GPC). For example, it is a value obtained by using polystyrene as a standard sample under the conditions that: the temperature of the column(s) (KF-805L, KF-803L and KF-802 available from SHOWA DENKO K. K.) is 40° C.; THF is used as the eluant; the flow rate is 0.2 ml/min; the detection is carried out by RI measurement; and the sample concentration is 0.02%. Values measured by the above-described method are used as number average molecular weights according to the present invention.

It is important that the hydroxyl value of the (meth)acrylic-based copolymer (A) is 2-100 mgKOH/g in terms of the solid content. The hydroxyl value is preferably 2-50 mgKOH/g, and more preferably 2-30 mgKOH/g. If the hydroxyl value of the (meth)acrylic-based copolymer (A) is higher than 100 mgKOH/g, the cross-linking of the easy-adhesive coating becomes denser and thus the adhesive strength with the plastic film (E) deteriorates. Further, even if the adhesion could be maintained in the early stage, the cross-linking reaction advances during the moisture/heat resistance test. As a result, there is a possibility that the adhesive strength deteriorates after the moisture/heat resistance test. On the other hand, if it is lower than 2 mgKOH/g, the cross-linking of the easy-adhesive coating becomes sparser and thus the moisture/heat resistance of the coating deteriorates. Therefore, the adhesive strength with the sealing agent deteriorates after the moisture/heat resistance test.

The (meth)acrylic-based copolymer (A) used in the present invention has one carbon-carbon double bond for every 5-500 side chains. Further, the (meth)acrylic-based copolymer (A) preferably has one carbon-carbon double bond for every 5-300 side chains. If the rate at which the (meth)acrylic-based copolymer (A) has carbon-carbon double bonds is higher than this range, the cross-linking reaction of the easy-adhesive occurs excessively and thus the adhesive strength deteriorates. On the other hand, if the rate is lower than this range, the cross-linking reaction does not occur sufficiently and thus a satisfactory adhesive strength cannot be obtained.

There are no particular restrictions on the sealing agent (II) located on the light-receiving side of the solar battery cell (III) and the sealing agent (IV) located on the non-light-receiving side. That is, publicly-known materials may be suitably used for them. Examples of the suitable materials include an EVA (ethylene-vinyl acetate copolymer), polyvinyl butyral, polyurethane, and polyolefin. Among them, an EVA is mainly used in consideration of the cost. Although a sealing agent in the form of a sheet (including the form of a film) may be used for the sealing agents (II) and (IV) with ease, a sealing agent in the form of a paste may be also used.

The sealing agent (II) located on the light-receiving side and the sealing agent (IV) located on the non-light-receiving side may contain an organic peroxide(s). By containing an organic peroxide(s) in the sealing agents (II) and (IV), it is possible, when the solar battery cell (III) is sandwiched between the sealing agents (II) and (IV) and heated, to cross-link the sealing agent (II), to cross-link the sealing agent (II) with the sealing agent (IV), and to cross-link the sealing agent (IV) by a radical reaction with high efficiency.

It is believed that by containing an organic peroxide(s) in the non-light-receiving-side sealing agent (IV), when the heating and sealing are performed, the organic peroxide(s) also acts on the carbon-carbon double bonds contained in the uncured easy-adhesive layer (D') (i.e., easy-adhesive layer (D') for which the curing process has not performed yet). As a result, it is believed that the non-light-receiving-side sealing agent (IV) is cross-linked with the uncured easy-adhesive layer (D') and the uncured easy adhesive layer (D') is cross-linked.

Therefore, in the present invention, the term "carbon-carbon double bonds" means carbon-carbon double bond parts (C=C) that are active to a radical reaction and can be mutually polymerized. Therefore, carbon-carbon double bonds that are inactive to the reaction, such as the benzene ring and the pyridine ring, are not included in the carbon-carbon double bonds in the present invention. Among them, it is preferable to contain a carbon-carbon double bond having a high reactivity such as a (meth)acryloyl group. Note that in this specification, the term "curing process" means a process for joining the sealing agent (IV) with the solar cell rear surface protection sheet (V) after they are placed on top of each other.

Examples of the (meth)acrylic-based copolymer (A) like this include the following (meth)acrylic-based copolymers (A1) to (A4).

A (meth)acrylic-based copolymer (A1) is a (meth)acrylic-based copolymer that is formed by reacting a (meth)acrylic-based monomer having a carboxyl group (a3) with glycidyl groups of side chains contained in a copolymer containing a (meth)acrylic-based monomer having a glycidyl group (a1), a (meth)acrylic-based monomer having a hydroxyl group (a2), and a (meth)acrylic-based monomer having no glycidyl group, no hydroxyl group, and no carboxyl group (a4) as constitutional units.

That is, a copolymer containing a (meth)acrylic-based monomer having a glycidyl group (a1), a (meth)acrylic-based monomer having a hydroxyl group (a2), and a (meth)acrylic-based monomer having no glycidyl group, no hydroxyl group, and no carboxyl group (a4) as constitutional units is obtained. Then, side chains of carbon-carbon double bonds can be introduced by reacting the (meth)acrylic-based monomer having a carboxyl group (a3) with all or part of glycidyl groups of side chains contained in the copolymer and thereby using the glycidyl groups as starting points.

A (meth)acrylic-based copolymer (A2) is a copolymer that is obtained by introducing side chains of carbon-carbon double bonds by using carboxyl groups as starting points. That is, the (meth)acrylic-based copolymer (A2) is a (meth)acrylic-based copolymer that is formed by reacting a (meth)acrylic-based monomer having a glycidyl group (a1) with carboxyl groups contained in a copolymer containing a (meth)acrylic-based monomer having a carboxyl group (a3), a (meth)acrylic-based monomer having a hydroxyl group (a2), and a (meth)acrylic-based monomer having no glycidyl group, no hydroxyl group, and no carboxyl group (a4) as constitutional units.

Similarly to the case of the (meth)acrylic-based copolymer (A1), it is possible to react the glycidyl groups with all or part of the carboxyl groups in order to introduce side chains of carbon-carbon double bonds.

A (meth)acrylic-based copolymer (A3) is a (meth)acrylic-based copolymer that is formed by reacting a (meth)acrylic-based monomer having an isocyanate group (a5) with a part of hydroxyl groups contained in a copolymer containing a (meth)acrylic-based monomer having a hydroxyl group (a2) and a (meth)acrylic-based monomer having no hydroxyl group (a6) as constitutional units.

A (meth)acrylic-based copolymer (A4) is a (meth)acrylic-based copolymer that is formed by reacting a (meth)acrylic-based monomer having a hydroxyl group (a2) with acid anhydride groups contained in a copolymer containing a maleic anhydride, a (meth)acrylic-based monomer having a hydroxyl group (a2), and a (meth)acrylic-based monomer having no hydroxyl group (a6) as constitutional units.

Examples of the (meth)acrylic-based monomer having a glycidyl group (a1) include glycidyl acrylate, glycidyl methacrylate, and 4-hydroxybutyl acrylate glycidyl ether.

Examples of the (meth)acrylic-based monomer having a hydroxyl group (a2) include 2-hydroxyethyl(meth)acrylate, 2-hydroxypropyl(meth)acrylate, and 4-hydroxybutyl(meth)acrylate. A hydroxyl group derived from this (meth)acrylic-based monomer having a hydroxyl group (a2) has a function of reacting with a polyisocyanate compound (B) (which is described later) and thereby forming the easy-adhesive layer (D) that is a cured substance of the uncured easy-adhesive layer (D').

Further, in the present invention, a monomer other than the (meth)acrylic-based monomer having a hydroxyl group (a2) is defined as a (meth)acrylic-based monomer having no hydroxyl group (a6).

Examples of the (meth)acrylic-based monomer having a carboxyl group (a3) include an acrylic acid, a methacrylic acid, a crotonic acid, an itaconic acid, and a citraconic acid.

A monomer other than the above-mentioned (meth) acrylic-based monomer having a glycidyl group (a1), the (meth)acrylic-based monomer having a hydroxyl group (a2), and the (meth)acrylic-based monomer having a carboxyl group (a3) is defined as a (meth)acrylic-based monomer having no glycidyl group, no hydroxyl group, and no carboxyl group (a4).

Examples of the (meth)acrylic-based monomer having no glycidyl group, no hydroxyl group, and no carboxyl group (a4) include methyl (meth)acrylate, ethyl (meth)acrylate, n-butyl (meth)acrylate, iso-butyl (meth)acrylate, tert-butyl (meth)acrylate, 2-ethylhexyl(meth)acrylate, and octyl (meth) acrylate.

Examples of the (meth)acrylic-based monomer having an isocyanate group (a5) include 2-isocyanato ethyl acrylate and 2-isocyanato ethyl methacrylate. Examples of products of these substances include Karenz AOI and Karenz MOI available from SHOWA DENKO K. K.

In addition to the (meth)acrylic-based monomers (a1) to (a6), vinyl acetate, vinyl ether, vinyl propionate, styrene, and the like may be also used as appropriate for the formation of the (meth)acrylic-based copolymers (A1) to (A4).

Incidentally, the above-described (meth)acrylic-based monomers (a1) to (a6) can be expressed in a general formula "$CH_2=CR^1-CO-OR^2$".

In the formula, $R^1$ represents a hydrogen atom or a methyl group.

$R^2$ represents a monovalent substituent having a functional group unique to each monomer such as a carboxyl group, a glycidyl group, a hydroxyalkyl group, and an isocyanatoalkyl group.

In the case of the (meth)acrylic-based monomers (a1) to (a6), the $R^2$ part is regarded as a side chain as opposed to the main chain formed by the $CH_2=CR^1$ polymerization. Therefore, the $R^2$ part is counted as one side chain.

Further, in the case of monomers that are not expressed by the above-mentioned general formula such as styrene and maleic anhydride, the part other than the part that forms a carbon-carbon double bond in the polymerization and thereby forms the main chain of the copolymer is referred to as a side chain. Therefore, it is counted in such a manner that one monomer has one side chain.

For example, supposing that maleic anhydride is reacted with 2-hydroxyethyl acrylate, the anhydrous ring of the maleic anhydride opens and thereby generates a carboxyl group and an ester linkage part. Even in the case like this, they are collectively counted as one side chain.

When the side chain is defined as described above, the ratio of side chains having a carbon-carbon double bond to all the side chains can be calculated in the following manner.

For example, the mole ratio of the monomers constituting a copolymer that is copolymerized in a weight ratio "MMA (methyl methacrylate, molecular weight 100)/n-BMA (n-butyl methacrylate, molecular weight 142)/HEMA (2-hydroxyethyl methacrylate, molecular weight 130)/GMA (glycidyl methacrylate, molecular weight 142)=18/78/2/2" is expressed as "MMA/n-BMA/HEMA/GMA=23.7/72.4/2/1.9". The mole ratio is equal to the ratio of the number of monomers. Further, because of the above-described definition of the side chain, it is counted in such a manner that each monomer has one side chain. Therefore, the mole ratio is equal to the ratio of the number of side chains. Therefore, this copolymer contains 1.9 glycidyl groups for every 100 side chains.

Further, the (meth)acrylic-based copolymer (A) that is obtained by denaturing the glycidyl groups contained in the above-described copolymer by an equal mole quantity of an acrylic acid contains side chains that are obtained in which the 1.9 glycidyl groups for every 100 side chains are converted into an equal number of carbon-carbon double bonds. That is, it can be safely said that the (meth)acrylic-based copolymer (A) contains one carbon-carbon double bond for every 53 side chains.

The first stage of the formation of the (meth)acrylic-based copolymer (A1), i.e., the stage in which (meth)acrylic-based monomers (a1), (a2) and (a4) are polymerized, the first stage of the formation of the (meth)acrylic-based copolymer (A2), i.e., the stage in which (meth)acrylic-based monomers (a3), (a2) and (a4) are polymerized, the first stage of the formation of the (meth)acrylic-based copolymer (A3), i.e., the stage in which (meth)acrylic-based monomers (a2) and (a6) are polymerized, and the first stage of the formation of the (meth) acrylic-based copolymer (A4), i.e., the stage in which maleic anhydride and (meth)acrylic-based monomers (a2) and (a6) are polymerized can be carried out by an ordinary radical polymerization reaction. There are no restrictions on the reaction method. That is, it can be carried out by using any publicly-known polymerization method such as solution polymerization, mass polymerization, and emulsion polymerization. However, the solution polymerization is preferred because the control of the reaction is easy and the subsequent operation can be immediately performed.

Examples of the solvent include methyl ethyl ketone, methyl isobutyl ketone, toluene, cellosolve, ethyl acetate, and butyl acetate. That is, any solvent in which the resin according to the present invention can be dissolved can be used without any restrictions. Further, only one type of a solvent may be used, or two or more solvents may be mixed. Further, as for the polymerization initiator used in the polymerization reaction, publicly-known initiators including: organic peroxides such as benzoyl peroxide, acetyl peroxide, methyl ethyl ketone peroxide, and lauroyl peroxide; and azo-based initiators such as azobisisobutyronitrile may be used. That is, there are no particular restrictions on the polymerization initiator. Further, for each of the (meth)acrylic-based copolymers (A1)

to (A4), only one type of a substance may be used, for example, for the (meth)acrylic-based monomer (a2), or two or more types of compounds may be used together. This is also true for the (meth)acrylic-based monomers (a1), (a3), (a4), (a5) and (a6).

Next, the polyisocyanate compound (B) is explained.

The polyisocyanate compound (B) reacts with hydroxyl groups that are derived from the (meth)acrylic-based monomer having a hydroxyl group (a2) and contained in the (meth)acrylic-based copolymer (A), and thereby gives a moisture/heat resistance to the easy-adhesive layer. In addition, the polyisocyanate compound (B) can also improve the contacting property with the plastic film (E) constituting the rear surface protection sheet and with the sealing agent such as an EVA which is used as the non-light-receiving-side sealing agent (IV). Therefore, it is important that the polyisocyanate compound (B) contains at least two isocyanate groups in one molecule. Examples of the polyisocyanate compound (B) include aromatic polyisocyanate, aliphatic chain polyisocyanate, and alicyclic polyisocyanate. Only one type of a compound may be used for the polyisocyanate compound (B), or two or more types of compounds may be used together.

Examples of the aromatic polyisocyanate include 1,3-phenylene diisocyanate, 4,4'-diphenyl diisocyanate, 1,4-phenylene diisocyanate, 4,4'-diphenylmethan diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4"-triphenyl methane triisocyanate.

Examples of the aliphatic chain polyisocyanate include trimethylene diisocyanate, tetramethylene diisocyanate, hexamethylene diisocyanate (HDI), pentamethylene diisocyanate, 1,2-propylene diisocyanate, 2,3-butylene diisocyanate, 1,3-butylene diisocyanate, dodecamethylene diisocyanate, and 2,4,4-trimethyl hexamethylene diisocyanate.

Examples of the alicyclic polyisocyanate include 3-isocyanate methyl-3,5,5-trimethylcyclohexyl isocyanate (IPDI), 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexyl isocyanate), and 1,4-bis(isocyanatemethyl)cyclohexane.

Further, in addition to the above-mentioned polyisocyanate, examples also include an adduct of the above-mentioned polyisocyanate and a polyol compound such as trimethylolpropane, a biuret and an isocyanurate of the above-mentioned polyisocyanate, and an adduct of the above-mentioned polyisocyanate and publicly-known polyether polyol, polyester polyol, acryl polyol, polybutadiene polyol, polyisoprene polyol, or the like.

Among these polyisocyanate compounds (B), a low-yellowing type aliphatic or alicyclic polyisocyanate is preferred in terms of the design. Further, an isocyanurate is preferred in terms of the moisture/heat resistance. More specifically, an isocyanurate of hexamethylene diisocyanate (HDI) and an isocyanurate 3-isocyanate methyl-3,5,5-trimethylcyclohexyl isocyanate (IPDI) are preferred.

Further, it is possible to obtain a blocked polyisocyanate compound (B1) by reacting roughly the whole amount of the isocyanate groups of these polyisocyanate compounds (B) with a blocking agent. The uncured easy-adhesive layer (D') obtained by applying an easy-adhesive for a solar cell rear surface protection sheet according to the present invention is preferably in an un-cross-linked state before it is bonded to the sealing agent (IV) to manufacture a solar cell module.

Therefore, the polyisocyanate compound (B) is preferably a blocked polyisocyanate compound (B1).

Examples of the blocking agent include: phenols such as phenol, thiophenol, methylthiophenol, xylenol, cresol, resorcinol, nitrophenol, and chlorophenol; oximes such as acetone oxime, methyl ethyl ketone oxime, and cyclohexanone oxime; alcohols such as methanol, ethanol, n-propyl alcohol, isopropyl alcohol, n-butyl alcohol, isobutyl alcohol, t-butyl alcohol, t-pentanol, ethylene glycol monomethyl ether, ethylene glycol monobutyl ether, diethylene glycol monomethyl ether, propylene glycol monomethyl ether, and benzyl alcohol; pyrazoles such as 3,5-dimethylpyrazole and 1,2-pyrazole; triazoles such as 1,2,4-triazole; halogen-substituted alcohols such as ethylenechlorohydrin and 1,3-dichloro-2-propanol; lactams such as ε-caprolactam, δ-valerolactam, γ-butyrolactam, and β-propllactam; and active methylene compounds such as methyl acetoacetate, ethyl acetoacetate, acetylacetone, methyl malonate, and ethyl malonate. In addition, examples also include amines, imides, mercaptans, imines, ureas, and diaryls. Only one type of a substance may be used for the blocking agent, or two or more types of substances may be used together for the blocking agent.

Among these blocking agents, those having a dissociation temperature of 80-150° C. are preferred. If the dissociation temperature is lower than 80° C., the curing reaction advances when the easy-adhesive is applied and the solvent is vaporized. As a result, there is a possibility that the contacting property with the filler deteriorates. If the dissociation temperature is higher than 150° C., the curing reaction does not advance sufficiently in the vacuum thermocompression bonding process that is performed when a solar cell module is formed. As a result, the contacting property with the filler deteriorates.

Examples of the blocking agent having a dissociation temperature of 80-150° C. include methyl ethyl ketone oxime (dissociation temperature: 140° C., the same applies hereafter), 3,5-dimethylpyrazole (12° C.) and diisopropylamine (120° C.).

It is necessary that the polyisocyanate compound (B) in the easy-adhesive according to the present invention is used in such an amount that 0.1-5 isocyanate groups are present for every one hydroxyl group of the (meth)acrylic-based copolymer (A). Preferably, 0.5-4 isocyanate groups are present for every one hydroxyl group. If the number is less than 0.1, the cross-link density becomes so low that the moisture/heat resistance becomes unsatisfactory. If the number is greater than 5, excessive isocyanate reacts with moisture in the atmosphere during the moisture/heat resistance test. As a result, the easy-adhesive coating becomes harder, and thereby causing a deterioration in the adhesion strength with the plastic film (E) constituting the rear surface protection sheet and/or with the sealing agent such as an EVA which is used as the non-light-receiving-side sealing agent (IV).

The easy-adhesive according to the present invention may also contain organic particles or inorganic particles in an amount of 0.01-30 wt. pts. based on 100 wt. pts. of the solid content. More preferably, the organic particles or inorganic particles may be contained in an amount of 0.1-10 wt. pts. By containing these particles in the easy-adhesive, it is possible to reduce the tucks on the surface of the uncured easy-adhesive layer (D'). If the content is less than 0.01 wt. pts., the tucks on the surface of the uncured easy-adhesive layer (D') cannot be sufficiently reduced. On the other hand, if the amount of the above-mentioned various particles is excessively high, they impair the closely-contact between the uncured easy-adhesive layer (D') and the sealing agent, and thereby possibly causing a deterioration in the adhesive strength.

In particular, as for the organic particles, it is preferable to use organic particles whose melting point or softening point is equal to or higher than 150° C. If the melting point or softening point is lower than 150° C. there is a possibility that the particles are softened in the vacuum thermocompression bonding process that is performed when a solar cell module is formed, and thereby impairing the adhesion with the sealing agent.

Specific examples of the organic particles include polymer particles made of polymers such as a polymethyl methacrylate resin, a polystyrene resin, a nylon resin (registered trademark), a melamine resin, a guanamine resin, a phenol resin, a urea resin, a silicon resin, a methacrylate resin, and an acrylate resin. Examples also include cellulose powder, nitrocellulose powder, wood flour, used-paper powder, chaff powder, and starch. Only one type of a substance may be used for the organic particles, or two or more types of substances may be used together for the organic particles.

The above-mentioned polymer particles can be obtained by a polymerization method such as the emulsion polymerization method, the suspension polymerization method, the dispersion polymerization method, the soap-free polymerization method, the seed polymerization method, and the micro-suspension polymerization method. Further, the above-described organic particles may contain impurities in such an extent that their characteristics are not impaired. Further, the particles may have any shape or form including a powder form, a particle form, a granular form, a plate form, and a fiber form.

Examples of the inorganic particles include inorganic particles containing an oxide, a hydroxide, a sulfate, a carbonate, a silicate, or the like of a metal such as magnesium, calcium, barium, zinc, zirconium, molybdenum, silicon, antimony, and titanium. More specifically, examples include inorganic particles containing silica gel, aluminum oxide, calcium hydroxide, calcium carbonate, magnesium oxide, magnesium hydroxide, magnesium carbonate, zinc oxide, lead oxide, diatomaceous earth, zeolite, aluminosilicate, talc, white carbon, mica, glass fibers, glass powder, glass beads, clay, wollastonite, iron oxide, antimony oxide, titanium oxide, lithopone, pumice powder, aluminum sulfate, zirconium silicate, barium carbonate, dolomite, molybdenum disulfide, iron sand, carbon black, or the like. Only one type of a substance may be used for the inorganic particles, or two or more types of substances may be used together for the inorganic particles.

Further, the above-described inorganic particles may contain impurities in such an extent that their characteristics are not impaired. Further, the particles may have any shape or form including a powder form, a particle form, a granular form, a plate form, and a fiber form.

Further, if necessary, a cross-linking accelerating agent may be added in the easy-adhesive according to the present invention in such an extent that the advantageous effect of the present invention is not impaired. The cross-linking accelerating agent acts as a catalyst that accelerates the urethane bonding reaction by a hydroxyl group of the (meth)acrylic-based copolymer (A) and an isocyanate group of the polyisocyanate compound (B). Examples of the cross-linking accelerating agent include tin compounds, metal salts, and bases. Specific examples of the cross-linking accelerating agent include tin octylate, dibutyltin diacetate, dibutyltin dilaurate, dioctyltin dilaurate, tin chloride, iron octylate, cobalt octylate, zinc naphthenate, triethylamine, and triethylenediamine. Only one substance from these substances may be used, or two or more substances may be combined.

Further, if necessary, various additives such as a filler, a thixotropy imparting agent, an aging preventive agent, an antioxidant, an antistatic agent, a flame retardant, a heat conductive improver, a plasticizer, a dripping preventive agent, an antifoulant, an antiseptic, a bactericide, an antifoaming agent, a leveling agent, a curing agent, a thickener, a pigment dispersing agent, and a silane coupling agent may be added to the easy-adhesive according to the present invention in such an extent that the advantageous effect of the present invention is not impaired.

The easy-adhesive used in the present invention includes a solvent.

As for the solvent, it is possible to use, according to the composition of the resin composition, an appropriate solvent(s) selected from:

alcohols such as methanol, ethanol, propanol, butanol, ethylene glycol methyl ether, and diethylene glycol methyl ether;

ketones such as methyl ethyl ketone, methyl isobutyl ketone, and cyclohexanone;

ethers such as tetrahydrofuran, dioxane, ethylene glycol dimethyl ether, and diethylene glycol dimethyl ether;

hydrocarbons such as hexane, heptanes, and octane;

aromatic compounds such as benzene, toluene, xylene, and cumene;

esters such as ethyl acetate and butyl acetate; and the like. However, a solvent having a boiling point of 50-200° C. can be preferably used. If the boiling point is lower than 50° C., the solvent tends to volatilize when the easy-adhesive is applied. As a result, the solid content increases, making it difficult to apply the easy-adhesive in a uniform thickness. If the boiling point is higher than 200° C., it becomes difficult to dry up the solvent. Note that two or more solvents may be used together.

The easy-adhesive according to the present invention makes it possible to form an easy-adhesive layer (D') by applying it on a plastic film (E), and thereby to manufacture a Solar cell rear surface protection sheet (V') having an excellent adhesive property with a sealing agent (IV).

The coating of the easy-adhesive according to the present invention onto the plastic film (E) may be carried out by using a publicly-known method. Specific examples of the coating method include comma coating, gravure coating, reverse coating, roll coating, lip coating, and spray coating. By applying the easy-adhesive by using these methods and then vaporizing the solvent by a heating/drying process, an uncured easy-adhesive layer (D') can be formed.

The thickness of the formed uncured easy-adhesive layer (D') is preferably 0.01-30 μm, and more preferably 0.1-10 μm.

As for the plastic film (E), a polyester-based resin film made of a polyester resin such as polyethylene terephthalate, polybutylene terephthalate, and polyethylene naphthalate; an olefin film made of polyolefin such as polyethylene, polypropylene, and polycyclopentadiene; a fluorine-based film such as a polyvinyl fluoride film, a polyvinylidene fluoride film, a polytetrafluoroethylene film, and an ethylene-tetrafluoroethylene copolymer film; an acryl film; a triacetyl cellulose film; or the like may be used. It is preferable to use a polyester-based resin film in terms of the film rigidity and the cost. Further, among the polyester-based resin films, a polyethylene terephthalate film is particularly preferred. The plastic film (E) may be formed in a single layer or in a multi-layer structure having two or more layers. Further, a vapor-deposition film(s) obtained by vapor-depositing a metal oxide or a nonmetal inorganic oxide may be laminated on the plastic film (E).

As for the vapor-deposited metal oxide or nonmetal inorganic oxide, an oxide of, for example, silicon, aluminum, magnesium, calcium, potassium, tin, sodium, boron, titanium, lead, zirconium, yttrium, or the like may be used. Further, a fluoride of an alkali metal, an alkaline-earth metal, or the like may be also used. Further, only one substance from these substances may be used, or two or more substances may be combined.

The metal oxide or nonmetal inorganic oxide may be deposited by using a publicly-known PVD method such as vacuum deposition, ion plating, and sputtering, or a CVD method such as plasma CVD and microwave CVD.

The plastic film (E) may be colorless or may contain a coloring components) such as a pigment and a dye. Examples of the method for incorporating a coloring component(s) into the plastic film (E) include a method in which a coloring component(s) is kneaded into the film in advance when the film is produced, and a method for printing a color component(s) on a colorless transparent film substrate. Further, a color film and a colorless transparent film may be bonded together and used in the bonded state.

In the solar cell rear surface protection sheet (V'), a single layer or a plurality of layers of a film layer(s) and/or a coating layer(s) formed from a metal foil (F) and/or a weatherproof resin layer (G) may be provided on the surface of the plastic film (E) on which the easy-adhesive layer (D') is not formed.

As for the metal foil (F), an aluminum foil, an iron foil, a zinc laminated plate, or the like may be used. Among these foils/plates, an aluminum foil is preferred in terms of the corrosion resistance. The thickness is preferably 10-100 μm, and more preferably 20-50 μm. Various publicly-known adhesives may be used for the lamination of the metal film (F).

As for the weatherproof resin layer (G), a resin layer that is obtained by laminating a polyvinylidene fluoride film, a polyester-based resin film made of a polyester-based resin such as polyethylene terephthalate, polybutylene terephthalate, and polynaphthalene terephthalate, or the like by using various publicly-known adhesive may be used. Alternatively, a coating layer formed by applying a high weatherproof paint such as Lumiflon available from Asahi Glass Co., Ltd, may be used.

Next, a solar cell module is explained.

The solar cell module 100 is obtained by laminating a solar cell front surface protection material (I), which is to be located on the light-receiving side of a solar battery cell (III), on the solar battery cell (III) with an uncured sealing agent (II), which is to be located on the light-receiving side of the solar battery cell (III), interposed therebetween, laminating an uncured solar cell rear surface protection sheet (V') with an uncured sealing agent (IV), which is to be located on the non-light-receiving side of the solar battery cell (III), interposed therebetween, and performing a high-temperature thermocompression bonding process under a reduced pressure.

There are no particular restrictions on the material for the solar cell front surface protection material (I). However, preferred examples of the material include a glass plate and a plastic plate such as a polycarbonate plate and a polyacrylate plate. A glass plate is preferred in terms of the transparency, the weather resistance, and the strength. Further, among the glass plates, a white-plate glass having high transparency is preferred.

The sealing agent such as an EVA which is used as the sealing agents (II) and (IV) may contain an additive(s) such as a UV absorber for improving the weather resistance, a light stabilizer, an organic peroxide for cross-linking the EVA itself.

The easy-adhesive layer (D') according to the present invention improves the adhesive strength with the sealing agent (IV) because carbon-carbon double bonds are cross-linked in the high-temperature thermocompression bonding process that is carried out when the solar cell module is formed. When an organic peroxide is contained in the sealing agent (IV), the cross-linking reaction is accelerated. As a result, an advantageous effect of the present invention is maximized. Therefore, the sealing agent located on the non-light-receiving side preferably contains an organic peroxide.

Examples of the solar battery cell (III) include a solar battery cell in which electrodes are provided on an optical/electrical conversion layer made of a compound semiconductor or the like, typified by crystalline silicon, amorphous silicon, and copper indium selenide, and a solar battery cell in which those optical/electrical conversion layer and electrodes are laminated on a substrate made of glass or the like.

EXAMPLES

The present invention is explained hereinafter in a more detailed manner by using examples. However, the present invention is not limited to the examples shown below. Note that in the examples, "pts." and "%" represent "wt. pts." and "wt. %" respectively. Table 1 shows physical properties of (meth)acrylic-based copolymers.

<(Meth)Acrylic-Based Copolymer A1 Solution>

A four-necked flask equipped with a cooling tube, a stirrer, a thermometer, and a nitrogen introducing tube was charged with 18 pts. of methyl methacrylate, 78 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Next, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A1 solution having a number average molecular weight of 39,000, a hydroxyl value of 17.2 (mg KOH/g), and a Tg of 30° C. was obtained. Further, the ratio of side chains containing a carbon-carbon double bond was 1/53 and the solid content was 50%.

Note that the number average molecular weight, the hydroxyl value, the glass transition temperature, the acid value, and the hydroxyl value were measured in the below-described manner. Further, the ratio of side chains containing a carbon-carbon double bond is a theoretical value that is obtained based on the amount of glycidyl methacrylate contained in the monomer used in the copolymerization.

<Measurement of Number Average Molecular Weight (Mn)>

Mn was obtained by using the above-described GPC (gel permeation chromatography).

<Measurement of Glass Transition Temperature (Tg)>

The glass transition temperature was obtained by the above-described differential scanning calorimetric measurement (DSC) method.

Note that samples that were obtained by heating the above-described acrylic resin solution for 15 minutes at 150° C. and thereby drying and solidifying the acrylic resin solution were used as samples for measuring the Tg.

<Measurement of Acid Value (AV)>

About 1 g of the sample (resin solution: about 50%) was precisely weighed and put into a stoppered conical flask and 100 ml of a toluene/ethanol mixture solution (volume ratio: toluene/ethanol=2/1) was added, and the sample was dissolved in the mixture solution. A phenolphthalein reagent was added in the solution as an indicator, and the solution was left as it was for 30 seconds. After that, the solution was titrated with a 0.1 N alcoholic potassium hydroxide solution until the solution exhibited salmon-pink. The acid value was calculated by the following expression. A value obtained when the resin was in a dried state was used as the acid value (unit: mg KOH/g).

$$\text{Acid Value(mg KOH/g)} = \{(5.611 \times a \times F)/S\}/(\text{Concentration of Nonvolatile Content}/100)$$

where: S: amount of collected sample (g);

a: amount of consumed 0.1 N alcoholic potassium hydroxide solution (ml); and

F: titer of 0.1 N alcoholic potassium hydroxide solution.

<Measurement of Hydroxyl Value (OHV)>

About 1 g of the sample (resin solution: about 50%) was precisely weighed and put into a stoppered conical flask and 100 ml of a toluene/ethanol mixture solution (volume ratio: toluene/ethanol=2/1) was added, and the sample was dissolved in the mixture solution. An exactly 5 ml of an acetylating agent (solution obtained by dissolving 25 g of acetic anhydride into pyridine of such an amount that the total volume became 100 ml) was added to the solution, and the mixture was stirred for about one hour. A phenolphthalein reagent was added in the solution as an indicator, and the solution was left as it was for 30 seconds. After that, the solution was titrated with a 0.1 N alcoholic potassium hydroxide solution until the solution exhibited salmon-pink. The hydroxyl value was calculated by the following expression. A value obtained when the resin was in a dried state was used as the hydroxyl value (unit: mg KOH/g).

$$\text{Hydroxyl Value(mg KOH/g)} = [\{(b-a) \times F \times 28.25\}/S]/(\text{Concentration of Nonvolatile Content}/100) + D$$

where: S: amount of collected sample (g);

a: amount of consumed 0.1 N alcoholic potassium hydroxide solution (ml);

b: amount of 0.1 N alcoholic potassium hydroxide solution consumed in a blank test (ml);

F: titer of 0.1 N alcoholic potassium hydroxide solution; and

D: acid value (mg KOH/g).

<(Meth)Acrylic-Based Copolymer A2 Solution>

A four-necked flask equipped with a cooling tube, a stirrer, a thermometer, and a nitrogen introducing tube was charged with 18 pts. of methyl methacrylate, 78 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.3 pts. of azobisisobutyronitrile was added and the mixture underwent a polymerization reaction for 2 hours. Next, 0.05 pts. of azobisisobutyronitrile was further added and the mixture underwent a polymerization reaction for 2 hours. Then, 0.05 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A2 solution having a number average molecular weight of 26,000, a hydroxyl value of 16.5 (mg KOH/g), and a Tg of 30° C. was obtained. Further, the ratio of side chains containing a carbon-carbon double bond was 1/53 and the solid content was 50%.

<(Meth)Acrylic-Based Copolymer A3 Solution>

A four-necked flask equipped with a cooling tube, a stirrer, a thermometer, and a nitrogen introducing tube was charged with 18 pts. of methyl methacrylate, 78 pts. of n-butyl methacrylate, 2 pts. of 2-hydroxyethyl methacrylate, 2 pts. of glycidyl methacrylate, and 100 pts. of toluene, and the mixture was heated to 80° C. while being stirred in a nitrogen atmosphere. Then, 0.075 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A3 solution having a number average molecular weight of 75,000, a hydroxyl value of 18.0 (mg KOH/g), and a Tg of 30° C. was obtained. Further, the ratio of side chains containing a carbon-carbon double bond was 1/53 and the solid content was 50%.

<(Meth)Acrylic-Based Copolymer A4 Solution>

A four-necked flask equipped with a cooling tube, a stirrer, a thermometer, and a nitrogen introducing tube was charged with 18 pts. of methyl methacrylate, 78 pts. of n-butyl methacrylate, 4 pts. of 2-hydroxyethyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone and 0.03 pts. dibutyltin dilaurate were added, and a solution obtained by dissolving 1.7 pts. of 2-isocyanato ethyl methacrylate into 1.7 pts. of methyl ethyl ketone was dropped in the mixture over two hours while stirring the mixture at 40° C. After it was confirmed that the isocyanate peak (2260 cm$^{-1}$) had disappeared by IR measurement, a (meth)acrylic-based copolymer A4 solution having a number average molecular weight of 38,000, a hydroxyl value of 8.6 (mg KOH/g), and a Tg of 30° C. was obtained. Further, the ratio of side chains containing a carbon-carbon double bond was 1/49 and the solid content was 50%.

<(Meth)Acrylic-Based Copolymer A5 Solution>

A four-necked flask equipped with a cooling tube, a stirrer, a thermometer, and a nitrogen introducing tube was charged with 18 pts. of methyl methacrylate, 78 pts. of n-butyl methacrylate, 4 pts. of 2-hydroxyethyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone and 0.03 pts. of dibutyltin dilaurate were added, and a solution obtained by dissolving 2.9 pts. of 2-isocyanato ethyl methacrylate into 2.9 pts. of methyl ethyl ketone was dropped in the mixture over two hours while stirring the mixture at 40° C. After it was confirmed that the isocyanate peak (2260 cm$^{-1}$) had disappeared by IR measurement, a (meth)acrylic-based copolymer A5 solution having a number average molecular weight of 33,000, a hydroxyl value of 2.1 (mg KOH/g), and a Tg of 27° C. was obtained. Further, the ratio of side chains containing a carbon-carbon double bond was 1/28 and the solid content was 50%.

<(Meth)Acrylic-Based Copolymer A6 Solution>

A four-necked flask equipped with a cooling tube, a stirrer, a thermometer, and a nitrogen introducing tube was charged with 18 pts. of methyl methacrylate, 78 pts. of n-butyl methacrylate, 2 pts. of 2-hydroxyethyl methacrylate, 2 pts. of phthalic anhydride, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that 0.85 pts. of 2-hydroxyethyl methacrylate and 0.5 pts. of triethylamine were added and the mixture was heated and stirred for 7 hours at 110° C. As a result, a (meth)acrylic-based copolymer A6 solution having a number average molecular weight of 36,000, a hydroxyl value of 8.5 (mg KOH/g), and a Tg of 30° C. was obtained. Further, the ratio of side chains containing a carbon-carbon double bond was 1/37 and the solid content was 50%.

<(Meth)Acrylic-Based Copolymer A7 Solution>

A four-necked flask equipped with a cooling tube, a stirrer, a thermometer, and a nitrogen introducing tube was charged with 96 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A7 solution having a number average molecular weight of 38,000, a hydroxyl value of 17.0 (mg KOH/g), and a Tg of 20° C. was obtained. Further, the ratio of side chains containing a carbon-carbon double bond was 1/50 and the solid content was 50%.

<(Meth)Acrylic-Based Copolymer A8 Solution>

A four-necked flask equipped with a cooling tube, a stirrer, a thermometer, and a nitrogen introducing tube was charged with 41 pts. of methyl methacrylate, 55 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A8 solution having a number average molecular weight of 41,000, a hydroxyl value of 8.5 (mg KOH/g), and a Tg of 51° C. was obtained. Further, the ratio of side chains containing a carbon-carbon double bond was 1/59 and the solid content was 50%.

<(Meth)Acrylic-Based Copolymer A9 Solution>

A four-necked flask equipped with a cooling tube, a stirrer, a thermometer, and a nitrogen introducing tube was charged with 20 pts. of methyl methacrylate, 63 pts. of n-butyl methacrylate, 15 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A9 solution having a number average molecular weight of 45,000, a hydroxyl value of 73.0 (mg KOH/g), and a Tg of 40° C. was obtained. Further, the ratio of side chains containing a carbon-carbon double bond was 1/55 and the solid content was 50%.

<(Meth)Acrylic-Based Copolymer A10 Solution>

A four-necked flask equipped with a cooling tube, a stirrer, a thermometer, and a nitrogen introducing tube was charged with 45 pts. of methyl methacrylate, 3 pts. of n-butyl methacrylate, 2 pts. of 2-hydroxyethyl methacrylate, 15 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 7.5 pts. of an acrylic acid were added and the mixture was heated and stirred for 15 hours at 100° C. After it was confirmed that the acid value was equal to or less than 2, a (meth)acrylic-based copolymer A10 solution having a number average molecular weight of 37,000, a hydroxyl value of 70.2 (mg KOH/g), and a Tg of 57° C. was obtained. Further, the ratio of side chains containing a carbon-carbon double bond was 1% and the solid content was 52%.

<(Meth)Acrylic-Based Copolymer A11 Solution>

A four-necked flask equipped with a cooling tube, a stirrer, a thermometer, and a nitrogen introducing tube was charged with 19.5 pts. of methyl methacrylate, 78 pts. of n-butyl methacrylate, 2 pts. of 2-hydroxyethyl methacrylate, 0.5 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 0.25 pts. of an acrylic acid were added and the mixture was heated and stirred for 15 hours at 100° C. After it was confirmed that the acid value was equal to or less than 2, a (meth)acrylic-based copolymer A11 solution having a number average molecular weight of 35,000, a hydroxyl value of 10.5 (mg KOH/g), and a Tg of 34° C. was obtained. Further, the ratio of side chains containing a carbon-carbon double bond was 1/222 and the solid content was 50%.

<(Meth)Acrylic-Based Copolymer A12 Solution>

A four-necked flask equipped with a cooling tube, a stirrer, a thermometer, and a nitrogen introducing tube was charged with 18 pts. of methyl methacrylate, 78 pts. of n-butyl methacrylate, 4 pts. of 2-hydroxyethyl methacrylate, and 100 pts. of ethyl acetate, and the mixture was heated to 77° C. while being stirred in a nitrogen atmosphere. Then, 0.05 pts. of azobisisobutyronitrile was added and the mixture underwent a polymerization reaction for 2 hours. Next, 22 pts. of ethyl acetate and 0.05 pts. of azobisisobutyronitrile were added and the mixture underwent a polymerization reaction for 2 hours. Then, 22 pts. of ethyl acetate and 0.05 pts. of azobisisobutyronitrile were further added and the mixture underwent a polymerization reaction for 2 hours. After that, 36 pts. of ethyl acetate and 0.05 pts. of azobisisobutyronitrile were added and the mixture underwent a polymerization reaction for 2 hours. Then, 0.05 pts. of azobisisobutyronitrile was further added and the mixture underwent a polymerization reaction for 2 hours.

After that, 0.03 pts. of hydro-chinone and 0.03 pts. of dibutyltin dilaurate were added, and a solution obtained by dissolving 1.7 pts. of 2-isocyanato ethyl methacrylate into 1.7 pts. of methyl ethyl ketone was dropped in the mixture over two hours while stirring the mixture at 40° C. After it was confirmed that the isocyanate peak (2260 cm$^{-1}$) had disappeared by IR measurement, a (meth)acrylic-based copolymer A12 solution having a number average molecular weight of 242,000, a hydroxyl value of 8.0 (mg KOH/g), and a Tg of 30° C. was obtained. Further, the ratio of side chains containing a carbon-carbon double bond was 1/49 and the solid content was 35%.

<(Meth)Acrylic-Based Copolymer A13 Solution>

A four-necked flask equipped with a cooling tube, a stirrer, a thermometer, and a nitrogen introducing tube was charged with 20 pts. of methyl methacrylate, 55 pts. of n-butyl methacrylate, 25 pts. of 2-hydroxyethyl methacrylate, and 100 pts. of toluene, and the mixture was heated to 100° C. while being stirred in a nitrogen atmosphere. Then, 0.13 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone and 0.03 pts. of dibutyltin dilaurate were added, and a solution obtained by dissolving 2.9 pts. of 2-isocyanato ethyl methacrylate into 2.9 pts. of methyl ethyl ketone was dropped in the mixture over two hours while stirring the mixture at 40° C. After it was confirmed that the isocyanate peak (2260 cm$^{-1}$) had disappeared by IR measurement, a (meth)acrylic-based copolymer A13 solution having a number average molecular weight of 44000, a hydroxyl value of 98.7 (mg KOH/g), and a Tg of 42° C. was obtained. Further, the ratio of side chains containing a carbon-carbon double bond was 1/51 and the solid content was 50%.

<(Meth)Acrylic-Based Copolymer A14 Solution>

A four-necked flask equipped with a cooling tube, a stirrer, a thermometer, and a nitrogen introducing tube was charged with 18 pts. of methyl methacrylate, 80 pts. of n-butyl methacrylate, 2 pts. of 2-hydroxyethyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours. A (meth)acrylic-based copolymer A14 solution having a number average molecular weight of 38,000, a hydroxyl value of 8.6 (mg KOH/g), and a Tg of 33° C. was obtained. Further, the ratio of side chains containing a carbon-carbon double bond was 0 and the solid content was 50%.

<(Meth)Acrylic-Based Copolymer A15 Solution>

A four-necked flask equipped with a cooling tube, a stirrer, a thermometer, and a nitrogen introducing tube was charged with 18 pts. of methyl methacrylate, 78 pts. of n-butyl methacrylate, 4 pts. of 2-hydroxyethyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone and 0.03 pts. of dibutyltin dilaurate were added, and a solution obtained by dissolving 3.3 pts. of 2-isocyanato ethyl methacrylate into 3.3 pts. of methyl ethyl ketone was dropped in the mixture over two hours while stirring the mixture at 40° C. After it was confirmed that the isocyanate peak (2260 cm$^{-1}$) had disappeared by IR measurement, a (meth)acrylic-based copolymer A15 solution having a number average molecular weight of 37,000, a hydroxyl value of 0 (mg KOH/g), and a Tg of 34° C. was obtained. Further, the ratio of side chains containing a carbon-carbon double bond was 1/25 and the solid content was 50%.

<(Meth)Acrylic-Based Copolymer A16 Solution>

A four-necked flask equipped with a cooling tube, a stirrer, a thermometer, and a nitrogen introducing tube was charged with 18 pts. of methyl methacrylate, 78 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.6 pts. of azobisisobutyronitrile was added and the mixture underwent a polymerization reaction for 2 hours. Next, 0.05 pts. of azobisisobutyronitrile was further added and the mixture underwent a polymerization reaction for 2 hours. Then, 0.05 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A16 solution having a number average molecular weight of 14,000, a hydroxyl value of 17.0 (mg KOH/g), and a Tg of 31° C. was obtained. Further, the ratio of side chains containing a carbon-carbon double bond was 1/53 and the solid content was 50%.

<(Meth)Acrylic-Based copolymer A17 Solution>

A four-necked flask equipped with a cooling tube, a stirrer, a thermometer, and a nitrogen introducing tube was charged with 30 pts. of n-butyl methacrylate, 66 pts. of 2-ethylhexyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A17 solution having a number average molecular weight of 35,000, a hydroxyl value of 18.3 (mg KOH/g), and a Tg of 0° C. was obtained. Further, the ratio of side chains containing a carbon-carbon double bond was 1/56 and the solid content was 50%.

<(Meth)Acrylic-Based Copolymer A18 Solution>

A four-necked flask equipped with a cooling tube, a stirrer, a thermometer, and a nitrogen introducing tube was charged with 63 pts. of methyl methacrylate, 33 pts. of n-butyl methacrylate, 2 pts. of 2-hydroxyethyl methacrylate, 2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 1 pt. of an acrylic acid were added and the mixture was heated and stirred for 15 hours at 100° C. After it was confirmed that the acid value was equal to or less than 2, a (meth)acrylic-based copolymer A18 solution having a number average molecular weight of 42,000, a hydroxyl value of 17.0 (mg KOH/g), and a Tg of 70° C. was obtained. Further, the ratio of side chains containing a carbon-carbon double bond was 1/63 and the solid content was 50%.

<(Meth)Acrylic-Based Copolymer A19 Solution>

A four-necked flask equipped with a cooling tube, a stirrer, a thermometer, and a nitrogen introducing tube was charged with 20 pts. of methyl methacrylate, 55 pts. of n-butyl methacrylate, 15 pts. of 2-hydroxyethyl methacrylate, 10 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 5 pts. of an acrylic acid were added and the mixture was heated and stirred for 15 hours at 100° C. After it was confirmed that the acid value was equal to or less than 2, a (meth)acrylic-based copolymer A19 solution having a number average molecular weight of 37,000, a hydroxyl value of 108 (mg KOH/g), and a Tg of 40° C. was obtained. Further, the ratio of side chains containing a carbon-carbon double bond was 1/11 and the solid content was 51%.

<(Meth)Acrylic-Based Copolymer A20 Solution>

A four-necked flask equipped with a cooling tube, a stirrer, a thermometer, and a nitrogen introducing tube was charged with 20 pts. of methyl methacrylate, 53 pts. of n-butyl methacrylate, 27 pts. of 2-hydroxyethyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone and 0.03 pts. dibutyltin dilaurate were added, and a solution obtained by dissolving 21 pts. of 2-isocyanato ethyl methacrylate into 21 pts. of methyl ethyl ketone was dropped in the mixture over two hours while stirring the mixture at 40° C. After it was confirmed that the isocyanate peak (2260 $cm^{-1}$) had disappeared by IR measurement, a (meth)acrylic-based copolymer A20 solution having a number average molecular weight of 40,000, a hydroxyl value of 8.0 (mg KOH/g), and a Tg of 43° C. was obtained. Further, the ratio of side chains containing a carbon-carbon double bond was 1/4 and the solid content was 50%.

<(Meth)Acrylic-Based Copolymer A21 Solution>

A four-necked flask equipped with a cooling tube, a stirrer, a thermometer, and a nitrogen introducing tube was charged with 19.8 pts. of methyl methacrylate, 78 pts. of n-butyl methacrylate, 2 pts. of 2-hydroxyethyl methacrylate, 0.2 pts. of glycidyl methacrylate, and 100 pts. of toluene, and the mixture was heated to 100° C. while being stirred in a nitrogen atmosphere. Then, 0.15 pts. of azobisisobutyronitrile was added and the mixture underwent a polymerization reaction for 2 hours. Next, 0.07 pts. of azobisisobutyronitrile was further added and the mixture underwent a polymerization reaction for 2 hours. Then, 0.07 pts. of azobisisobutyronitrile was further added and the mixture underwent a polymerization reaction for 2 hours.

After that, 0.03 pts. of hydro-chinone, 0.8 pts. of dimethyl benzylamine, and 0.1 pts. of an acrylic acid were added and the mixture was heated and stirred for 15 hours at 100° C. After it was confirmed that the acid value was equal to or less than 2, a (meth)acrylic-based copolymer A21 solution having a number average molecular weight of 37,000, a hydroxyl value of 8.8 (mg KOH/g), and a Tg of 34° C. was obtained. Further, the ratio of side chains containing a carbon-carbon double bond was 1/556 and the solid content was 50%.

<Polyisocyanate Compound Solution B>

A polyisocyanate compound solution (B) was obtained by diluting an isocyanurate of hexamethylene diisocyanate, which was blocked by 3,5-dimethylpyrazole, to a concentration of 75% with ethyl acetate.

<Adjustment of Easy-Adhesive Solution>

Easy-adhesive solutions 1 to 26 were obtained by mixing a (meth)acrylic-based copolymer (A) solution and a polyisocyanate compound (B) solution in compositions shown in Table 2, and then mixing 0.01 wt. pts. of dioctyltin laurate based on 100 wt. pts. of the solid content of the (meth)acrylic-based copolymer (A) as a catalyst in each composition.

<Manufacturing of Solar Cell Rear Surface Protection Sheet>

Both surfaces of a polyester film (Tetoron (registered trademark) S, available from. Teijin DuPont Films Japan Limited, thickness: 188 μm) were corona-treated, and a polyester adhesive "Dinareo VA-3020/HD-701" (available from TOYOCHEM Co., Ltd., mixing ratio: 100/7, the same applies hereafter) was applied to one surface of the polyester film by using a gravure coater. By drying the solvent, an adhesive layer having a coating amount of 10 g/m² was provided. The vapor-deposition surface of the below-shown vapor-deposition PET (Teck Barrier LX available from Mitsubishi Plastics Inc., thickness: 12 μm) was placed over the adhesive layer. After that, a polyester film/vapor-deposition PET laminate was manufactured by carrying out an aging process at 50° C. for four days and thereby curing the adhesive layer.

Further, a polyester adhesive "Dinareo VA-3020/HD-701" (available from TOYOCHEM Co., Ltd., mixing ratio: 100/7, the same applies hereafter) was applied to the vapor-deposition PET side surface of the polyester film/vapor-deposition PET laminate by using a gravure coater. By drying the solvent, an adhesive layer having a coating amount of 10 g/m² was provided. A polyvinyl fluoride film (Tedlar available from Du Pont Kabushiki Kaisha, thickness: 50 μm) was placed over the adhesive layer. After that, a polyester film/vapor-deposition PET/polyvinyl fluoride film laminate was manufactured by carrying out an aging process at 50° C. for four days and thereby curing the adhesive layer.

Further, the easy-adhesive solution 1 was applied to the polyester film surface of the polyester film/vapor-deposition PET/polyvinyl fluoride film laminate by using a gravure coater. Then, a solar cell rear surface protection sheet 1 was manufactured by drying the solvent and thereby providing an easy-adhesive layer having a coating amount of 1 g/m².

Similarly to the solar cell rear surface protection sheet 1, solar cell rear surface protection sheets 2 to 26 were manufactured by using the easy-adhesive 2 to 26.

A solar cell rear surface protection sheet 27 having a layer structure composed of a polyester film/vapor-deposition PET/polyvinyl fluoride film was manufactured without providing the easy-adhesive layer by using a similar manufacturing method to that of the solar cell rear surface protection sheet 1.

<Manufacture of Sample for Evaluating Adhesive Strength>

A white-plate glass, a vinyl acetate-ethylene copolymer film (standard cure type available from SANVIC inc., hereinafter "EVA film"), and the solar cell rear surface protection sheet 1 were successively placed on top of each other in such a manner that the easy-adhesive layer of the solar cell rear surface protection sheet 1 comes into contact with the EVA film. After that this laminate was put into a vacuum laminator and the air in the vacuum laminator was discharged so that the pressure was reduced to 1 Torr. After the laminate was heated for 30 minutes at 150° C. under a pressure of 0.1 MPa, the laminate was further heated for 30 minutes at 150° C. As a result, a 10 cm square sample 1 for evaluating an adhesive strength was manufactured.

Similarly to the sample 1 for evaluating an adhesive strength, samples 2 to 26 for evaluating an adhesive strength were manufactured by using the solar cell rear surface protection sheets 2 to 26.

Similarly to the sample 1 for evaluating an adhesive strength, a sample 27 for evaluating an adhesive strength was manufactured by successively placing a white-plate glass, an EVA film, and the solar cell rear surface protection sheet 27 on top of each other in such a manner that the polyester film side surface of the solar cell rear surface protection sheet 27 comes into contact with the EVA film.

Example 1

By using the sample 1 for evaluating an adhesive strength, the adhesive property of the easy-adhesive layer with the EVA film and the adhesive property after moisture/heat resistance tests (500 hours, 1000 hours, and 2000 hours) were evaluated by using the below-described method.

<Measurement of Adhesive Property>

The solar cell rear surface protection sheet 1 surface of the sample 1 for evaluating an adhesive strength was cut into a strip(s) having a width of 15 mm, and the adhesive strength between the easy-adhesive layer formed in the solar cell rear surface protection sheet 1 and the EVA film was measured. For the measurement, a 180-degree peel test was carried out at a load speed of 100 mm/min by using a tensile testing device. Evaluations were made for obtained measurement values in the following manner:

⊚: no less than 50N/15 mm;

○: no less than 30N/15 mm and less than 50N/15 mm;

Δ: no less than 10N/15 mm and less than 30N/15 mm; and x: less than 10N/15 mm.

<Adhesive Property After Moisture/Heat Resistance Test>

Similarly to the adhesive property measurement, the adhesive property of the sample 1 for evaluating an adhesive strength was evaluated again after moisture/heat resistance tests, i.e., after the sample 1 was left untouched for 500 hours, 1000 hours, and 2000 hours in an environment of a temperature of 85*° C. and a relative humidity of 85% RH.

Examples 2 to 16, Comparative Examples 1 to 10

Similarly to Example 1, the adhesive property of the easy-adhesive layer with the EVA film and the adhesive property after moisture/heat resistance tests were evaluated by using samples 2 to 26 for evaluating an adhesive strength.

Comparative Example 11

By using the sample 27 for evaluating an adhesive strength, which was manufactured without using the easy-adhesive solution, the adhesive property between the polyester film surface and the EVA film and the adhesive property after moisture/heat resistance tests were evaluated. Table 2 shows the results of the above-described evaluations.

TABLE 1

| | Composition | Tg | Number average molecular weight | OH value mgKOH/g | Ratio of side chains conaining carbon-carbon double bond |
|---|---|---|---|---|---|
| A1 | MMA/n-BMA/HEMA/GMA (AA denaturation) = 18/78/2/2 | 30 | 39000 | 17.2 | 1/53 |
| A2 | MMA/n-BMA/HEMA/GMA (AA denaturation) = 18/78/2/2 | 30 | 26000 | 16.5 | 1/53 |
| A3 | MMA/n-BMA/HEMA/GMA (AA denaturation) = 18/78/2/2 | 30 | 75000 | 18.0 | 1/53 |
| A4 | MMA/n-BMA/HEMA/HEMA (MOI denaturation) = 18/78/2/2 | 30 | 38000 | 8.6 | 1/49 |
| A5 | MMA/n-BMA/HEMA/HEMA (MOI denaturation) = 18/78/0.5/3.5 | 27 | 33000 | 2.1 | 1/28 |
| A6 | MMA/n-BMA/HEMA/MIAH (HEMA denaturation) = 18/78/2/2 | 30 | 36000 | 8.5 | 1/37 |
| A7 | n-BMA/HEMA/GMA (AA denaturation) = 96/2/2 | 20 | 38000 | 17.0 | 1/50 |
| A8 | MMA/n-BMA/HEMA/GMA (AA denaturation) = 41/55/2/2 | 51 | 41000 | 8.5 | 1/59 |
| A9 | MMA/n-BMA/HEMA/GMA (AA denaturation) = 20/63/15/2 | 40 | 45000 | 73.0 | 1/55 |
| A10 | MMA/n-BMA/HEMA/GMA (AA denaturation) = 45/38/2/15 | 57 | 37000 | 70.2 | 1/8 |
| A11 | MMA/n-BMA/HEMA/GMA (AA denaturation) = 19.5/78/2/0.5 | 34 | 35000 | 10.5 | 1/222 |
| A12 | MMA/n-BMA/HEMA/HEMA (MOI denaturation) = 18/78/2/2 | 30 | 242000 | 8.0 | 1/49 |
| A13 | MMA/n-BMA/HEMA/HEMA (MOI denaturation) = 20/55/23/2 | 42 | 44000 | 98.7 | 1/51 |
| A14 | MMA/n-BMA/HEMA = 18/80/2 | 33 | 38000 | 8.6 | 0 |
| A15 | MMA/n-BMA/HEMA (MOI denaturation) = 18/78/4 | 34 | 37000 | 0 | 1/25 |
| A16 | MMA/n-BMA/HEMA/GMA (AA denaturation) = 18/78/2/2 | 31 | 14000 | 17.0 | 1/53 |
| A17 | n-BMA/2-EHMA/HEMA/GMA (AA denaturation) = 30/66/2/2 | 0 | 35000 | 18.3 | 1/56 |
| A18 | MMA/n-BMA/HEMA/GMA (AA denaturation) = 63/33/2/2 | 70 | 42000 | 17 | 1/63 |
| A19 | MMA/n-BMA/HEMA/GMA (AA denaturation) = 20/55/15/10 | 40 | 37000 | 108 | 1/11 |
| A20 | MMA/n-BMA/HEMA/HEMA (MOI denaturation) = 20/53/2/25 | 43 | 40000 | 8.0 | 1/4 |
| A21 | MMA/n-BMA/HEMA/GMA (AA denaturation) = 19.8/78/2/0.2 | 34 | 37000 | 8.8 | 1/556 |

TABLE 2

Solar cell rear surface protection sheet

| | | | Easy-adhesive solution | | | | | | Contact property | | |
|---|---|---|---|---|---|---|---|---|---|---|---|
| | | | Acrylic-based copolymer (A) | | | | Polyisocyanate compound (B) | | | | |
| | | | Tg | Mn | OH value | Side chain having C=C (*1) | Mixing amount (*2) | NCO/OH ratio | Initial | Moisture/heat resistance test After 1000 hr. | Moisture/heat resistance test After 2000 hr. |
| Examples | 1 | 1 A1 | 30 | 39000 | 17.2 | 1/53 | 18 | 2 | ◎ | ◎ | ◎ |
| | 2 | 2 A2 | 30 | 26000 | 16.5 | 1/53 | 18 | 2 | ◎ | ◎ | ○ |
| | 3 | 3 A3 | 30 | 75000 | 18 | 1/53 | 19 | 2 | ◎ | ◎ | ◎ |
| | 4 | 4 A4 | 30 | 38000 | 8.6 | 1/49 | 9 | 2 | ◎ | ◎ | ◎ |
| | 5 | 5 A5 | 27 | 33000 | 2.1 | 1/28 | 2 | 2 | ◎ | ◎ | ◎ |
| | 6 | 6 A6 | 30 | 36000 | 8.5 | 1/37 | 9 | 2 | ◎ | ◎ | ○ |
| | 7 | 7 A7 | 20 | 38000 | 17 | 1/50 | 10 | 2 | ◎ | ◎ | ○ |
| | 8 | 8 A8 | 51 | 41000 | 8.5 | 1/59 | 9 | 2 | ○ | ○ | ○ |
| | 9 | 9 A9 | 40 | 45000 | 73 | 1/55 | 78 | 2 | ○ | ○ | ○ |
| | 10 | 10 A10 | 57 | 37000 | 70.2 | 1/8 | 75 | 2 | ○ | ○ | ○ |
| | 11 | 11 A11 | 34 | 35000 | 10.5 | 1/222 | 11 | 2 | ○ | ○ | ○ |
| | 12 | 12 A1 | 30 | 39000 | 17.2 | 1/53 | 5 | 0.5 | ◎ | ◎ | ○ |
| | 13 | 13 A1 | | | | | 9 | 1 | ◎ | ◎ | ◎ |
| | 14 | 14 A1 | | | | | 36 | 4 | ◎ | ◎ | ◎ |
| | 15 | 15 A12 | 30 | 242000 | 8 | 1/49 | 9 | 2 | ○ | ○ | ○ |
| | 16 | 16 A13 | 42 | 44000 | 98.7 | 1/51 | 52 | 1 | ○ | ○ | Δ |
| Comparative examples | 1 | 17 A14 | 33 | 38000 | 8.6 | 0 | 9 | 2 | Δ | Δ | X |
| | 2 | 18 A15 | 34 | 37000 | 0 | 1/25 | 0 | 0 | ○ | X | X |
| | 3 | 19 A16 | 31 | 14000 | 17 | 1/53 | 18 | 2 | ○ | Δ | X |
| | 4 | 20 A17 | 0 | 35000 | 18.3 | 1/56 | 20 | 2 | Δ | Δ | X |
| | 5 | 21 A18 | 70 | 42000 | 17 | 1/63 | 18 | 2 | Δ | Δ | Δ |
| | 6 | 22 A19 | 40 | 37000 | 108 | 1/11 | 116 | 2 | Δ | X | X |
| | 7 | 23 A20 | 43 | 40000 | 8 | 1/4 | 8.5 | 2 | X | X | X |
| | 8 | 24 A21 | 34 | 37000 | 8.8 | 1/556 | 9.5 | 2 | ○ | Δ | X |
| | 9 | 25 A1 | 30 | 39000 | 17.2 | 1/53 | 0 | 0 | ○ | X | X |
| | 10 | 26 A1 | | | | | 90 | 10 | Δ | X | X |
| | 11 | | | | without adhesive | | | | ○ | X | X |

(*1) Side chain having C=C ... ratio of side chains having C=C to all side chains
(*2) Mixing ratio ... mixing amount (wt. pts.) of each polyisocyanate compound (B) based on 100 wt. pts. of solid content of each copolymer (A) solution
*3 0.01 wt. pts. of dioctyltin laurate is mixed based on 100 wt. pts. of solid content of each copolymer (A) as a catalyst in each composition.

As shown in Table 2, Examples 1 to 16, which are solar cell rear surface protection sheets using an easy-adhesive according to the present invention, have a satisfactory adhesive property and an adhesive property after moisture/heat resistance tests.

In contrast to this, Example 1 is poor in the adhesive property because the (meth)acrylic-based copolymer does not contain the carbon-carbon double bond in the side chain.

As for Example 2, since the OH value is less than two, the cross-linking is insufficient and thus the adhesive property after the moisture/heat resistance test is poor.

As for Example 3, the number average molecular weight of the acrylic-based copolymer is so small that the adhesive property after the moisture/heat resistance test is poor.

As for Example 4, the Tg of the (meth)acrylic-based copolymer (A) is so low that the cohesive force is small. As a result, the adhesive property is poor. As for Example 5, the Tg of the (meth)acrylic-based copolymer (A) is so high that the easy-adhesive layer (D') becomes harder. As a result, the adhesive property is poor.

As for Example 6, the OH value of the acrylic-based copolymer is greater than 100. As for Example 7, the ratio of side chains containing a carbon-carbon double bond of the acrylic-based copolymer is so high that the cross-linking is excessive. As a result, the adhesive property is poor.

As for Example 8, since the ratio of side chains containing a carbon-carbon double bond of the acrylic-based copolymer is excessively high, a satisfactory adhesive property cannot be obtained.

As for Example 9, since the NCO/OH ratio of the acrylic-based copolymer and the curing agent is zero, the adhesive property is poor after the moisture/heat resistance test. As for Example 10, the NCO/OH ratio is 10 and thus the cross-linking is excessive. As a result, the adhesive property and the adhesive property after the moisture/heat resistance test are poor.

Example 17

Manufacture of Solar Cell Module

White-plate glass . . . solar cell front surface protection material (I)
EVA film . . . light-receiving-side sealing agent (II)
Polycrystalline silicon solar cell element . . . solar battery cell (III)
EVA film . . . non-light-receiving-side sealing agent (IV)

After the above-listed elements (I) to (IV) and a solar cell rear surface protection sheet 1 were successively placed on top of each other in such a manner that the easy-adhesive layer of the solar cell rear surface protection sheet 1 comes into contact with the non-light-receiving-side sealing agent (IV), the laminate was put into a vacuum laminator and the air in the vacuum laminator was discharged so that the pressure was reduced to 1 Torr. After the laminate was heated for 30 minutes at 150° C. under the atmospheric pressure, which was used as the press pressure, the laminate was further heated 30 minutes at 150° C. As a result, a 10 cm square solar cell module 1 for evaluating optical/electrical conversion efficiency was manufactured.

<Measurement of Optical/Electrical Conversion Efficiency>

The solar cell output of the obtained solar cell module 1 was measured in order to measure optical/electrical conversion efficiency by using a solar simulator (SS-100XIL available from Eko Instruments Co., Ltd.) in accordance with JIS C8912.

Further, the optical/electrical conversion efficiency was also measured in a similar manner after moisture/heat resistance tests, i.e., after the solar cell module 1 was left untouched for 500 hours, 1000 hours, 1500 hours, and 2000 hours in an environment of a temperature of 85° C. and a relative humidity of 85% RH. Evaluations were made by calculating rates at which the optical/electrical conversion efficiency deteriorates from the initial optical/electrical conversion efficiency to the optical/electrical conversion efficiency after the moisture/heat resistance test in the following manner:

○: output deterioration is less than 10%;
Δ: output deterioration is no less than 10% and less than 15%; and
×: output deterioration is no less than 20%.

Examples 18 to 23, Comparative Examples 12 to 16

Similarly to Example 17, solar cell modules 2 to 12 were manufactured by using the solar cell rear surface protection sheets 2 to 7, 17, 19, 20, 23 and 24, and their optical/electrical conversion efficiencies (initial, after moisture/heat resistance test) were measured.

Comparative Example 17

Comparative example 17 was manufactured in a similar manner to that of Example 17 except that the solar cell rear surface protection sheet 27 was used in place of the solar cell rear surface protection sheet 1 and was laminated in such a manner that the polyester film surface of the solar cell rear surface protection sheet 27 comes into contact with the non-light-receiving-side sealing agent (IV). Further, its optical/electrical conversion efficiencies (initial, after moisture/heat resistance test) were measured. Table 3 shows the results of the above-described evaluations.

TABLE 3

| | | | | Solar cell module | | | | |
|---|---|---|---|---|---|---|---|---|
| | | | | | Deterioration in output after moisture/heat resistance test | | | |
| | | | | Solar cell | Moisture/heat resistance test (85° C. 85%) | | | |
| | | | Solar cell module | rear surface protection sheet | after 500 hr. | after 1000 hr. | after 1500 hr. | after 2000 hr. |
| Examples | | 17 | 1 | 1 | ○ | ○ | ○ | ○ |
| | | 18 | 2 | 2 | ○ | ○ | ○ | ○ |
| | | 19 | 3 | 3 | ○ | ○ | ○ | ○ |
| | | 20 | 4 | 4 | ○ | ○ | ○ | ○ |
| | | 21 | 5 | 5 | ○ | ○ | ○ | ○ |
| | | 22 | 6 | 8 | ○ | ○ | ○ | ○ |
| | | 23 | 7 | 7 | ○ | ○ | ○ | ○ |

TABLE 3-continued

| | | | Solar cell module | Deterioration in output after moisture/heat resistance test Moisture/heat resistance test (85° C. 85%) | | | |
|---|---|---|---|---|---|---|---|
| | | Solar cell module | Solar cell rear surface protection sheet | after 500 hr. | after 1000 hr. | after 1500 hr. | after 2000 hr. |
| Comparative examples | | 12 | 8 | 17 | Δ | Δ | X | X |
| | | 13 | 9 | 19 | ○ | Δ | X | X |
| | | 14 | 10 | 20 | Δ | X | X | X |
| | | 15 | 11 | 23 | X | X | X | X |
| | | 16 | 12 | 24 | ○ | Δ | X | X |
| | | 17 | 13 | 27 | Δ | X | X | X |

As shown in Table 3, no deterioration in the output performance was observed for of Examples 17 to 23. In contrast, in Comparative examples 12 to 17, since the adhesive property between the EVA film and the solar cell rear surface protection sheet is insufficient, the solar cell element has deteriorated due to the moisture infiltration. As a result, the optical/electrical conversion efficiency deteriorates.

This application is based upon and claims the benefit of priority from Japanese patent application No. 2010-154392, filed on Jul. 7, 2010, the disclosure of which is incorporated herein in its entirety by reference.

REFERENCE SIGNS LIST

I SOLAR CELL FRONT SURFACE PROTECTION MATERIAL LOCATED ON LIGHT-RECEIVING SIDE OF SOLAR BATTERY CELL
II SEALING AGENT LOCATED ON LIGHT-RECEIVING SIDE OF SOLAR BATTERY CELL
III SOLAR BATTERY CELL
IV SEALING AGENT LOCATED ON NON-LIGHT-RECEIVING SIDE OF SOLAR BATTERY CELL
V SOLAR CELL REAR SURFACE PROTECTION SHEET

The invention claimed is:

1. An adhesive composition for a solar cell rear surface protection sheet, comprising:
a (meth)acrylic-based copolymer (A) having a glass transition temperature of 10-60° C., a number average molecular weight of 25,000-250,000, and a hydroxyl value of 2-100 (mgKOH/g), and containing one carbon-carbon double bond for every 5-500 side chains; and
a polyisocyanate compound (B), the polyisocyanate compound (B) being contained in such an amount that a number of an isocyanate group is 0.1-5 for every one hydroxyl group contained in the (meth)acrylic-based copolymer (A),
wherein the cured composition comprises an adhesive peel strength after 2000 hours at 85° C. and 85 percent humidity of no less than 30 N per 15 mm.

2. The adhesive composition for a solar cell rear surface protection sheet according to claim 1, wherein the (meth)acrylic-based copolymer (A) is a copolymer selected from a group consisting of following (meth)acrylic-based copolymers (A1) to (A4):
a (meth)acrylic-based copolymer (A1): a (meth)acrylic-based copolymer that is formed by reacting a (meth)acrylic-based monomer containing a carboxyl group (a3) with a glycidyl group of a side chain contained in a copolymer containing a (meth)acrylic-based monomer containing a glycidyl group (a1), a (meth)acrylic-based monomer containing a hydroxyl group (a2), and a (meth)acrylic-based monomer containing no glycidyl group, no hydroxyl group, and no carboxyl group (a4) as constitutional units;
a (meth)acrylic-based copolymer (A2): a (meth)acrylic-based copolymer that is formed by reacting a (meth)acrylic-based monomer containing a glycidyl group (a1) with a carboxyl group contained in a copolymer containing a (meth)acrylic-based monomer containing a carboxyl group (a3), a (meth)acrylic-based monomer containing a hydroxyl group (a2), and a (meth)acrylic-based monomer containing no glycidyl group, no hydroxyl group, and no carboxyl group (a4) as constitutional units;
a (meth)acrylic-based copolymer (A3): a (meth)acrylic-based copolymer that is formed by reacting a (meth)acrylic-based monomer containing an isocyanate group (a5) with a part of a hydroxyl group contained in a copolymer containing a (meth)acrylic-based monomer containing a hydroxyl group (a2) and a (meth)acrylic-based monomer containing no hydroxyl group (a6) as constitutional units; and
a (meth)acrylic-based copolymer (A4): a (meth)acrylic-based copolymer that is formed by reacting a (meth)acrylic-based monomer containing a hydroxyl group (a2) with an acid anhydride group contained in a copolymer containing a maleic anhydride, a (meth)acrylic-based monomer containing a hydroxyl group (a2), and a (meth)acrylic-based monomer containing no hydroxyl group (a6) as constitutional units.

3. The adhesive composition for a solar cell rear surface protection sheet according to claim 1, wherein the polyisocyanate compound (B) is a blocked polyisocyanate compound (B1).

4. A solar cell rear surface protection sheet comprising: an uncured adhesive comprising:
a (meth)acrylic-based copolymer (A) having a glass transition temperature of 10-60° C., a number average molecular weight of 25,000-250,000, and a hydroxyl value of 2-100 (mgKOH/g), and containing one carbon-carbon double bond for every 5-500 side chains; and
a polyisocyanate compound (B), the polyisocyanate compound (B) being contained in such an amount that a number of an isocyanate group is 0.1-5 for every one hydroxyl group contained in the (meth)acrylic-based copolymer (A),
wherein the cured adhesive composition comprises an adhesive peel strength after 2000 hours at 85° C. and 85 percent humidity of no less than 30 N per 15 mm; and
a plastic film.

5. A solar cell module comprising:

a solar battery cell;

a solar cell front surface protection material that protects the solar battery cell through a sealing agent disposed on a light-receiving side, the solar cell front surface protection material being disposed on the light-receiving side; and a solar cell rear surface protection sheet that protects the solar battery cell through a sealing agent disposed on a non-light-receiving side, the solar cell rear surface protection sheet being disposed on the non-light-receiving side, wherein the solar cell rear surface protection sheet is obtained by disposing a solar cell rear surface protection sheet comprising a plastic film and an uncured adhesive layer comprising:

a (meth)acrylic-based copolymer (A) having a glass transition temperature of 10-60° C., a number average molecular weight of 25,000-250,000, and a hydroxyl value of 2-100 (mgKOH/g), and containing one carbon-carbon double bond for every 5-500 side chains; and a polyisocyanate compound (B), the polyisocyanate compound (B) being contained in such an amount that a number of an isocyanate group is 0.1-5 for every one hydroxyl group contained in the (meth)acrylic-based copolymer (A), in such a manner that the adhesive layer comes into contact with the sealing agent disposed on the non-light-receiving side, and curing the adhesive layer wherein the cured composition comprises an adhesive peel strength after 2000 hours at 85° C. and 85 percent humidity of no less than 30 N per 15 mm.

6. The solar cell module according to claim 5, wherein the sealing agent disposed on the non-light-receiving side contains an organic peroxide.

7. The solar cell module according to claim 5, wherein the sealing agent disposed on the non-light-receiving side contains an ethylene-vinyl acetate copolymer (EVA) as a main component.

* * * * *